United States Patent [19]
Han et al.

[11] Patent Number: 5,773,852
[45] Date of Patent: Jun. 30, 1998

[54] SHORTED ANODE LATERAL INSULATED GATE BIPOLAR TRANSISTOR

[75] Inventors: Min-Koo Han; Byeong-Hoon Lee; Moo-Sup Lim; Yearn-Ik Choi, all of Seoul; Jung-Eon Park; Won-Oh Lee, both of Kumi-shi, all of Rep. of Korea

[73] Assignee: Korea Electronics Co., Ltd., Kumi-shi, Rep. of Korea

[21] Appl. No.: 679,564

[22] Filed: Jul. 15, 1996

[30] Foreign Application Priority Data

Mar. 20, 1996 [KR] Rep. of Korea ........................ 96-7510

[51] Int. Cl.[6] ........................ H01L 29/74; H01L 31/111
[52] U.S. Cl. ........................ 257/139; 257/140; 257/141
[58] Field of Search ........................ 257/139, 140, 257/141, 143, 144, 157, 162, 350, 351, 343

[56] References Cited

FOREIGN PATENT DOCUMENTS 5-283622  10/1993  Japan ........................ 257/343
5335556  12/1993  Japan ........................ 257/162

*Primary Examiner*—Wael Fahmy
*Attorney, Agent, or Firm*—Oblon, Spivak, McClelland, Maier & Neustadt, P.C.

[57] ABSTRACT

A shorted anode lateral insulated gate bipolar transistor includes a semiconductor layer of a first conductivity type, a first current electrode, a second current electrode, a first insulation layer, a first gate electrode, a second gate electrode, a first high concentration impurity region of a second conductivity type, a low concentration impurity region of the second conductivity type, a first high concentration impurity region of the first conductivity type, a second high concentration impurity region of the second conductivity type, a third high concentration impurity region of the second conductivity type, and a second high concentration impurity region of the first conductivity type.

8 Claims, 5 Drawing Sheets

SHORTED ANODE LATERAL INSULATED GATE BIPOLAR TRANSISTOR

BACKGROUND OF THE INVENTION

1. Field of the Invention

The present invention relates to an insulated gate bipolar transistor, and more particularly, to a shorted anode lateral insulated gate bipolar transistor(SA-LIGBT) which can efficiently suppress a snap back.

2. Description of the Prior Art

In accordance with recent trends toward a miniaturized, light and thin power controller, researches for integrating a power device and a controlling circuit thereof on a single chip has been actively made. Such a power integrated circuit is used in a switching mode power supply(SMPS), a display driver or an automobile electronic apparatus, and is expected to be widely applied in the whole electronic industry. Particularly, in case that a reduced surface field(RESURF) structure is adopted, a high-voltage device can be realized by using a thin epi-substrate. In this reason, researches for power devices for the power integrated circuit are under vigorous progress.

The researches for devices applicable to the power integrated circuit is mostly concentrated on an IGBT and a power MOSFET. The IGBT has a less voltage drop, but is slow at switching. The power MOSFET has a fast switching speed, but an on-state resistance is drastically increased if a rated voltage is increased. To overcome these shortcomings, there has been proposed an SA-LIGBT which uses the electric conductivity modulation characteristics of the IGBT during forward operation and uses the fast operation characteristics of the power MOSFET during switching operation.

FIG. 1 illustrates a cross-sectional view of a conventional SA-LIGBT integrated on an SOI substrate. Referring to FIG. 1, the SOI substrate is composed of a silicon substrate 10, a first insulation layer 12, and an N– epitaxial layer 14, which are stacked in a successive manner. On the main surface of the N– epitaxial layer 14, there are provided an N buffer region 32 formed below an anode electrode 16 to a constant depth, a P+ anode region 18 the upper surface of which contacts with the anode electrode 16 and which defines a PN junction with the N buffer region 32, an N+ anode short region 34 the upper surface of which contacts with the anode electrode 16 and one side of which defines a PN junction with the P+ anode region 18, a P– channel region 20 spaced apart from a cathode electrode 22 by a predetermined distance, a P+ well 24 the upper surface of which contacts with the cathode electrode 22 and one side of which contacts with the P– channel region 20, and an N+ cathode region 26 the upper surface of which contacts with the cathode electrode 22 and which defines a PN junction with the P+ well 24 and the P– channel region 20. A first gate electrode 28 is formed in a second insulation layer 30 above the P– channel region 20 which is disposed between the N+ cathode region 26 and the N– epitaxial layer 14.

By closely observing FIG. 1, it is to be understood that the structure shown therein is similar to that of a typical LIGBT except that the P+ anode region 18 is shorted from the N buffer region 32 by diffusing the N+ anode short region 34 into the anode electrode 16. In this case, if a positive voltage exceeding a threshold voltage level is applied to the first gate electrode 28 and a voltage applied to the anode electrode 16 is increased, electrons are injected into the N– epitaxial layer 14 through the P– channel region 20 and then flow to the N+ anode short region 34 by the drift due to an electric field. At this time, since a conductivity modulation does not occur in the N– epitaxial layer 14 in the operation region, the voltage is drastically reduced at the N– epitaxial layer 14, and the current density is to be small. If the voltage applied to the anode electrode 16 is continuously increased, the voltage drop is caused in the N buffer region 32 beneath the P+ anode region 18. If the value of the voltage drop exceeds about 0.7V, a hole current at the P+ anode region 18 flows to the N– epitaxial layer 14 via the N buffer region 32. Accordingly, the conductivity modulation occurs at the N-epitaxial layer 14 so that the voltage drop at the N– epitaxial layer 14 is drastically reduced. By this, in spite of the increase of the current flowing into the device, a negative resistance in which a voltage is decreased, occurs, which is referred to as a snap back.

FIG. 2 is a graph showing the current-to-voltage characteristics of the SA-LIGBT structure of FIG. 1 and describing the snap back phenomenon. Such snap back severely occurs due to low resistivity of the N buffer region 32 which is used for preventing a punch-through breakdown in the RESURF structure.

The snap back causing an inhomogeneous current flow in the device when turning on it, should be suppressed. To avoid the snap back, there have been used methods of increasing the voltage drop beneath the P+ anode region 18. However, due to low resistivity of the N buffer region 32, the conventional methods cannot efficiently attain the suppression of the snap back.

SUMMARY OF THE INVENTION

Accordingly, the present invention has been made in view of the above-described problems occurring in the prior art, and an object of the present invention is to provide a shorted anode lateral insulated gate bipolar transistor(SA-LIGBT) having an auxiliary gate for efficiently suppressing a snap back.

To accomplish the above objects, there is provided a shorted anode lateral insulated gate bipolar transistor(SA-LIGBT) comprising: a) a semiconductor layer of a first conductivity type; b) a first current electrode formed in the surface of the semiconductor layer; c) a second current electrode formed in the surface of the semiconductor layer and spaced apart from the first current electrode; d) a first insulation layer formed in the surface of the semiconductor layer and disposed between the first current electrode and the second current electrode; e) a first gate electrode formed within the first insulation layer in the vicinity of the first current electrode; f) a second gate electrode formed within the first insulation layer in the vicinity of the second current electrode; g) a first high concentration impurity region of a second conductivity type formed in the vicinity of the surface of the semiconductor layer below the first current electrode to a first depth; h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type to a second depth lower than the first depth; i) a first high concentration impurity region of the first conductivity type formed in the vicinity of the surface of the semiconductor layer ranging from the first gate electrode to a part of the first current electrode to a third depth lower than the second depth; j) an intermediate concentration impurity region of the first conductivity type formed in the vicinity of the surface of the semiconductor layer disposed throughout below the second gate electrode, below the first insulation layer between the second gate electrode and the second current electrode, and below the second current electrode to a fourth depth; k) a second high concentration impurity region of the second conductivity type formed in the vicinity of the surface of the semiconductor layer adjacent to the intermediate concentration impurity region of the first conductivity to a fifth depth; l) a third high concentration impurity region of the second conductivity type formed in the vicinity of the surface of the semiconductor layer ranging from the second gate electrode to a part of the second current electrode to the fifth depth; and m) a second high concentration impurity region of the first conductivity type formed to be adjacent with the third high concentration impurity region of a second conductivity type below the second current electrode to the third depth.

According to another aspect of the present invention, there is provided a shorted anode lateral insulated gate bipolar transistor comprising: a) a semiconductor layer of a first conductivity type; b) a first current electrode formed in the surface of the semiconductor layer; c) a second current electrode formed in a trench formed in the semiconductor layer and spaced apart from the first current electrode; d) a first insulation layer formed in the surface of the semiconductor layer and disposed between the first current electrode and the second current electrode; e) a first gate electrode formed within the first insulation layer in the vicinity of the first current electrode; f) a second gate electrode formed within the first insulation layer in the vicinity of the second current electrode; g) a first high concentration impurity region of a second conductivity type formed in the vicinity of the surface of the semiconductor layer below the first current electrode to a first depth; h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type to a second depth lower than the first depth; i) a first high concentration impurity region of the first conductivity type formed in the vicinity of the surface of the semiconductor layer ranging from the first gate electrode to a part of the first current electrode to a third depth lower than the second depth; j) an intermediate concentration impurity region of the first conductivity type formed in the vicinity of the surface of the semiconductor layer disposed throughout below the second gate electrode, below the first insulation layer between the second gate electrode and the second current electrode, and below the second current electrode to a fourth depth; k) a second high concentration impurity region of the second conductivity type formed in the vicinity of the surface of the semiconductor layer adjacent to the intermediate concentration impurity region of the first conductivity to a fifth depth; l) a third high concentration impurity region of the second conductivity type formed in the vicinity of the surface of the semiconductor layer ranging from the second gate electrode to a part of the second current electrode to the fifth depth; and m) a third impurity region of the second conductivity type formed in the vicinity of the surface of the semiconductor layer below the second gate electrode and below the second insulation layer between the second gate electrode layer and second current electrode to the fifth depth, and one side of which is adjacent the second current electrode.

According to another aspect of the present invention, there is provided a shorted anode lateral insulated gate bipolar transistor comprising: a) a semiconductor layer of a first conductivity type; b) a first current electrode formed in the surface of the semiconductor layer; c) a second current electrode formed in the surface of the semiconductor layer and spaced apart from the first current electrode; d) a first insulation layer formed in the surface of the semiconductor layer and disposed between the first current electrode and the second current electrode; e) a first gate electrode formed within the first insulation layer in the vicinity of the first current electrode; f) a second gate electrode formed within the first insulation layer in the vicinity of the second current electrode; g) a first high concentration impurity region of a second conductivity type formed in the vicinity of the surface of the semiconductor layer below the first current electrode to a first depth; h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type to a second depth lower than the first depth; i) a first high concentration impurity region of the first conductivity type formed in the vicinity of the surface of the semiconductor layer ranging from the first gate electrode to a part of the first current electrode to a third depth lower than the second depth; j) an intermediate concentration impurity region of the first conductivity type formed in the vicinity of the surface of the semiconductor layer disposed throughout below the second gate electrode, below the first insulation layer between the second gate electrode and the second current electrode, and below the second current electrode to a fourth depth; k) a third high concentration impurity region of the second conductivity type formed in the vicinity of the surface of the semiconductor layer ranging from the second gate electrode to a part of the second current electrode to a fifth depth; and l) a second high concentration impurity region of the first conductivity type formed to be adjacent the third high concentration impurity region of a second conductivity type below the second current electrode to the third depth.

According to another aspect of the present invention, there is provided a shorted anode lateral insulated gate bipolar transistor comprising: a) a semiconductor layer of a first conductivity type; b) a first current electrode formed in the surface of the semiconductor layer; c) a second current electrode formed in a trench formed in the semiconductor layer and spaced apart from the first current electrode; d) a first insulation layer formed in the surface of the semiconductor layer and disposed between the first current electrode and the second current electrode; e) a first gate electrode formed within the first insulation layer in the vicinity of the first current electrode; f) a second gate electrode formed within the first insulation layer in the vicinity of the second current electrode; g) a first high concentration impurity region of a second conductivity type formed in the vicinity of the surface of the semiconductor layer below the first current electrode to a first depth; h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type to a second depth lower than the first depth; i) a first high concentration impurity region of the first conductivity type formed in the vicinity of the surface of the semiconductor layer ranging from the first gate electrode to a part of the first current electrode to a third depth lower than the second depth; j) an intermediate concentration impurity region of the first conductivity type formed in the vicinity of the surface of the semiconductor layer disposed throughout below the second gate electrode, below the first insulation layer between the second gate electrode and the second current electrode, and below the second current electrode to a fourth depth; k) a third high concentration impurity region of the second conductivity type formed in the vicinity of the surface of the semiconductor layer ranging from the second gate electrode to a part of the second current electrode to a fifth depth; and l) a third impurity region of the second conductivity type formed in the vicinity of the surface of the semiconductor layer below the second gate electrode and below the second insulation layer between the second gate electrode layer and second current electrode to the fifth depth, and one side of which is adjacent the second current electrode.

According to another aspect of the present invention, a second insulation layer is provided between a semiconductor substrate of the second conductivity type and a first semiconductor layer of the first conductivity type.

According to another aspect of the present invention, the first conductivity type is an N type, and the second conductivity type is a P type.

According to still another aspect of the present invention, the level of the voltage applied to the second gate electrode is increased in proportion to the impurity concentration of the semiconductor layer.

By the features of the present invention, by using an epitaxial layer having a resistivity larger than that of a buffer region for conversion from a MOS mode into a bipolar mode, it is possible to prevent the generation of the negative resistance region, thereby the snap back can be efficiently suppressed.

BRIEF DESCRIPTION OF THE DRAWINGS

The above objects, other features and advantages of the present invention will become more apparent by describing a preferred embodiment thereof with reference to the accompanying drawings in which.

DETAILED DESCRIPTION OF THE PREFERRED EMBODIMENTS

Figure 1:
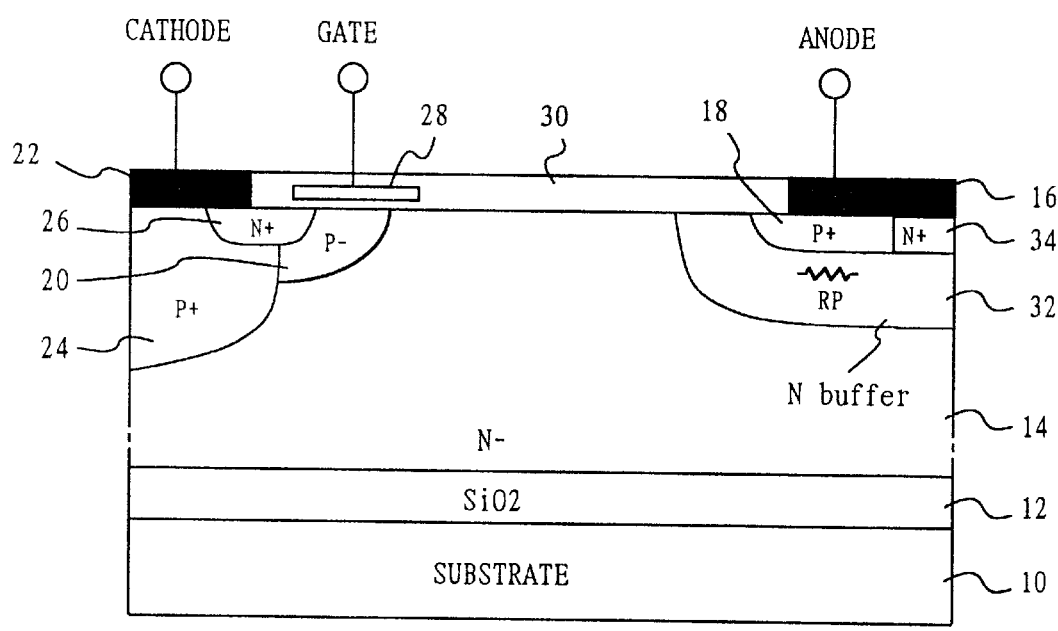
FIG. 1 is a cross-sectional view of an SA-LIGBT structure integrated on an SOI substrate, of the prior art.
Figure 2:
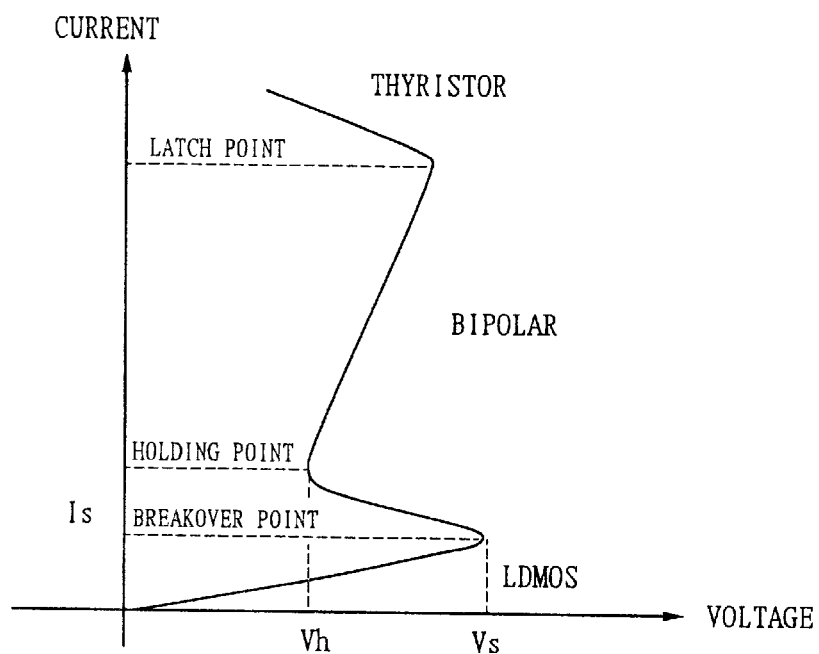
FIG. 2 is a graph showing the current-to-voltage characteristics of the SA-LIGBT structure of FIG. 1.
Figure 3:
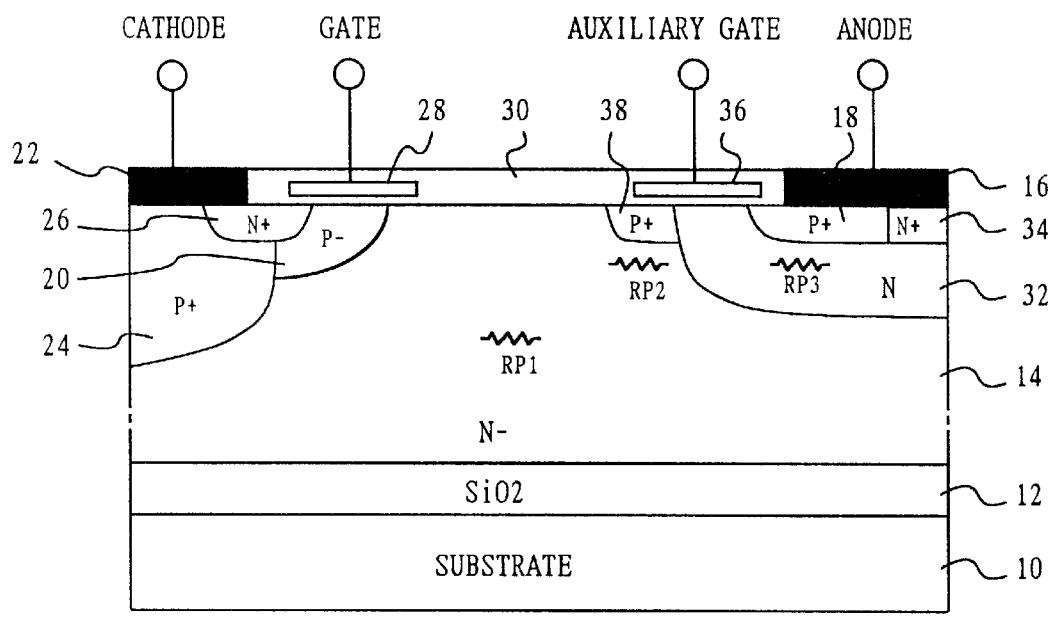
FIG. 3 is a cross-sectional view of an SA-LIGBT structure integrated on an SOI substrate in accordance with an embodiment of the present invention.

Referring to FIG. 3, there is illustrated a cross-sectional view of an SA-LIGBT structure integrated on an SOI substrate, in accordance with an embodiment of the present invention. The SA-LIGBT includes a semiconductor substrate 10, on which an oxide layer 12 is formed as a first insulation layer to define a silicon-on insulator(SOI) substrate. A first conductivity type epitaxial layer 14 e.g., containing N type impurities, is epitaxially grown on the SOI substrate. On the epitaxial layer 14, there are provided a first current electrode formed of a metal, i.e., a cathode electrode 22; a second current electrode spaced apart from the cathode electrode 22, i.e., an anode electrode 16; and a second insulation layer 30 disposed between the cathode electrode 22 and the anode electrode 16. In the second insulation layer 30, there are provided a first gate electrode 28 formed in the vicinity of the cathode electrode 22; and a second gate electrode 36, i.e., an auxiliary gate electrode formed in the vicinity of the anode electrode 16.

In the left side of the SA-LIGBT, there are provided a first P+ high concentration impurity region of a second conductivity type, i.e., a P+ well 24 formed to a first depth on the N− epitaxial layer 14 below the cathode electrode 22; a P− low concentration impurity region of the second conductivity type, i.e., a P− channel region 20 formed to a second depth which is smaller than the first depth, vertically between the N− epitaxial layer 14 and the second insulation layer 30 and horizontally between the first gate electrode 28 and the cathode electrode 22 to be adjacent the P+ well 24; and a first N+ high concentration impurity region of the first conductivity type, i.e., a N+ cathode region 26 formed to a third depth which is smaller than the second depth, between the first gate electrode 28 and the cathode electrode 22.

In the right side of the SA-LIGBT, there are provided an intermediate concentration impurity region of the first conductivity type, i.e., an N buffer region 32 formed to a fourth depth, on the N− epitaxial layer 14 and below the second insulation layer 30 and the anode electrode 16; a second high concentration impurity region of the second conductivity type, i.e., a P+ auxiliary anode region 38 formed to a fifth depth, between the N− epitaxial layer 14 and the second insulation layer 30 adjacent the N buffer region 32; a third high concentration impurity region of the second conductivity type, i.e., P+ anode region 18 formed to a fifth depth, on the N buffer region 32 and below the second insulation layer 30 and the anode electrode 16; and a second N+ high concentration impurity region of the first conductivity type, i.e., an N+ anode short region 34 formed to the third depth, between the N buffer region 32 and the anode electrode 16 adjacent the P+ anode region 18.

Figure 4:
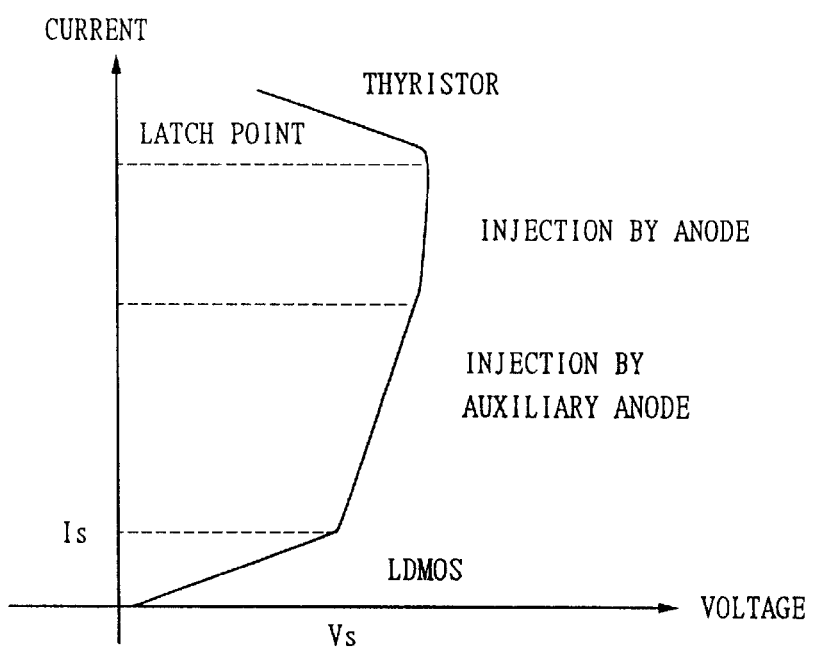
FIG. 4 is a graph showing the current-to-voltage characteristics of the SA-LIGBT structure of FIG. 3.

When compared to the conventional SA-LIGBT structure, the SA-LIGBT structure according to the first embodiment of the present invention further includes the P+ auxiliary anode region 38 and the auxiliary gate electrode 36. In the forward operation of the device, if an appropriate level of negative voltage is applied to the auxiliary gate electrode 36, the P+ anode region 18 and the P+ auxiliary anode region 38 are connected via a P− channel. By this, the voltage drop of the lower part of the P+ anode region 18 which is necessary when the operation of the SA-LIGBT is converted from a MOSFET mode to an IGBT mode, is obtained from the N− epitaxial layer 14 having a large resistivity as well as the N buffer layer 32 having a small resistivity, thereby it is possible to suppress the snap back. In other words, as best shown in FIG. 4, when an anode voltage is increased, since the voltage drop at the N– epitaxial layer 14 due to the current in an LD-MOS mode is considerably large, the sufficient voltage drop necessary for a hole injection can be obtained from the lower part of the P–channel formed between the P+ anode region 18 and the P+ auxiliary anode region 38, even if the anode voltage is small.

When the device is turned off, the voltage applied to the first gate electrode 28 is removed to block the channel current, the voltage applied to the auxiliary gate electrode 36 is removed to isolate the P+ auxiliary anode region 38 from the P+ anode region 18, and the holes disposed on the N– epitaxial layer 14 and electrons satisfying the charge neutralizing conditions are removed, thereby a switching speed as fast as that of the conventional SA-LIGBT can be obtained.

Figure 5:
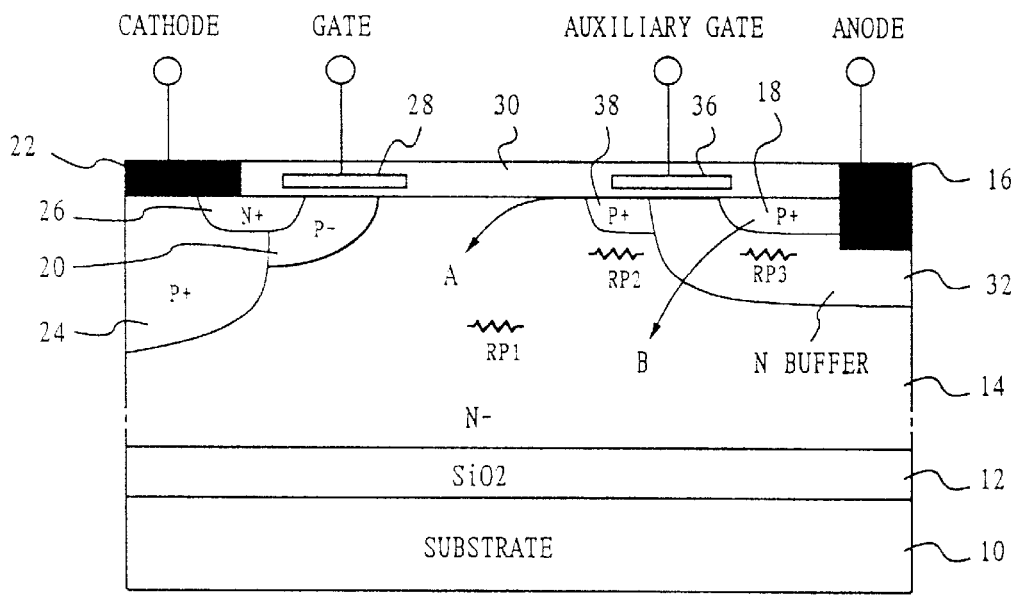
FIG. 5 is a cross-sectional view of an SA-LIGBT structure integrated on an SOI substrate in accordance with another embodiment of the present invention.

FIG. 5 illustrates a cross-sectional view of an SA-LIGBT structure integrated on an SOI substrate in accordance with a second embodiment of the present invention. The SA-LIGBT of the second embodiment has the same configuration with that of the first embodiment except that instead of the N+ anode short region 34 of the first embodiment, a trench is formed up to the N buffer region 32, and the anode electrode 16 is formed within the trench. Accordingly, the N buffer region 32 directly contacts with the anode electrode 16. Since the operation of the SA-LIGBT of the second embodiment is almost the same as that of the first embodiment, the detailed description thereof will be omitted.

The working effect of the SA-LIGBT of the present invention constructed as mentioned above will now be described in detail.

Figure 6:
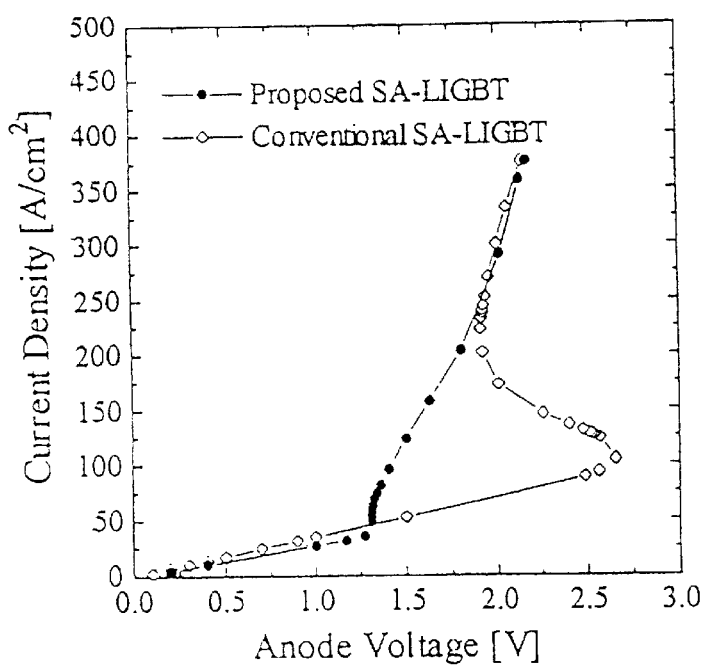
FIG. 6 is a graph showing the relation between current density and anode voltage in the SA-LIGBT of the prior art and the present invention.

FIG. 6 is a graph showing the relation between current density and anode voltage in the SA-LIGBT of the prior art and the present invention. In the conventional structure, when the anode voltage reaches 2.7V, the hole injection is started at the P+ anode region 18 and the voltage drop at the N– epitaxial layer 14 due to the conductivity modulation is decreased in spite of the increase of current so that the negative voltage regions where the voltage applied to both ends of the device is reduced are manifested. On the contrary, in the structure according to the present invention, when the anode voltage reaches 1.3V, the hole injection due to the P–channel is started so that the negative voltage regions are scarcely observed.

Figure 7:
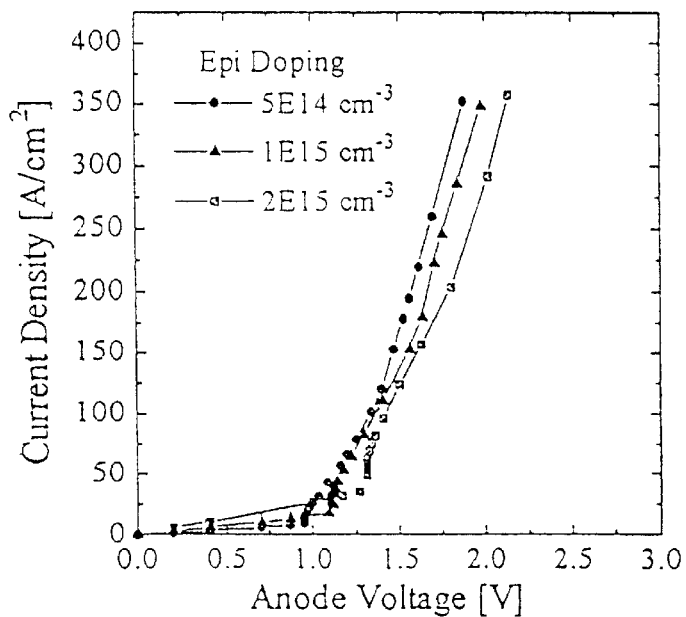
FIG. 7 is a graph showing the relation between current density and anode voltage depending on the change of impurity concentration of an epitaxial layer of the SA-LIGBT structure of the present invention.

Referring to FIG. 7, since the structure of the present invention utilizes the voltage drop at the N– epitaxial layer 14 beneath the P+ auxiliary anode region 38, when the impurity doping concentration of the N– epitaxial layer 14 is changed, the snap back generating anode voltage $V_S$ and the current $I_S$ are also changed. Thus, the more the concentration of the N– epitaxial layer 14 is increased, the more the snap back generating anode voltage $V_S$ and the current $I_S$ are increased. Since the SA-LIGBT initially operates in the MOSFET mode, an on-state resistance is decreased as the concentration of the N– epitaxial layer 14 is increased, thereby both the slope of the current-voltage curve and the current $I_S$ are caused to be increased. Also, the voltage drop beneath the P+ auxiliary anode region 38 is reduced by the increase in the concentration of the N– epitaxial layer 14 so that the higher anode voltage is necessitated for the hole injection.

Figure 8:
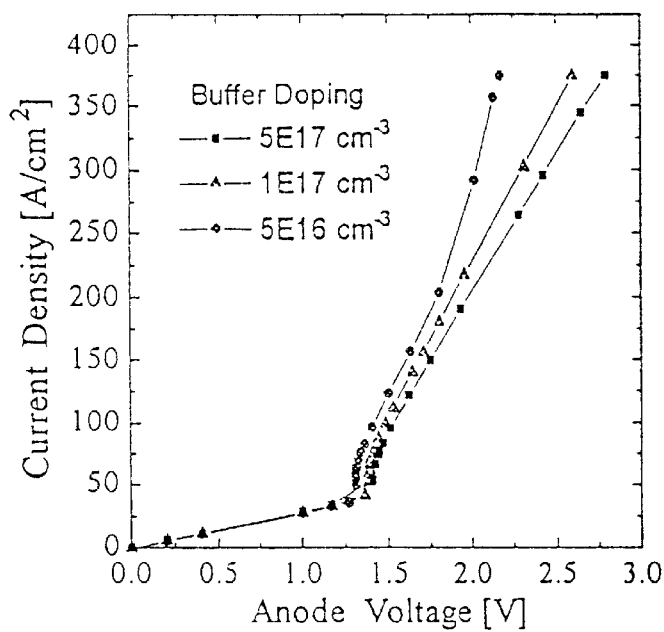
FIG. 8 is a graph showing the relation between current density and anode voltage depending on the change of impurity concentration of a buffer region of the SA-LIGBT structure of the present invention.

FIG. 8 is a graph showing the relation between current density and anode voltage depending on the change of impurity concentration of a buffer region of the SA-LIGBT structure of the present invention. In the conventional structure using the voltage drop at the N buffer region 32 for the hole injection, the anode voltage $V_S$ is gradually increased as the concentration of the N buffer region 32 is increased so that the negative resistance region is considerably increased. However, in the structure of the present invention, since the voltage drop at the N– epitaxial layer 14 is mainly used rather than that at the N buffer region 32, the anode voltage $V_S$ is scarcely changed although the concentration of the N buffer region 32 is changed. When the anode voltage $V_S$ is increased, the slope of the current-voltage curve is increased in case of the device in which the N buffer region 32 has a low concentration. This is because when the concentration of the N buffer region 32 is low, the hole injection is started not only at the P+ anode region 18 but also at the P+ auxiliary anode region 38 as the anode voltage is increased, to cause more conductivity modulation.

Figure 9:
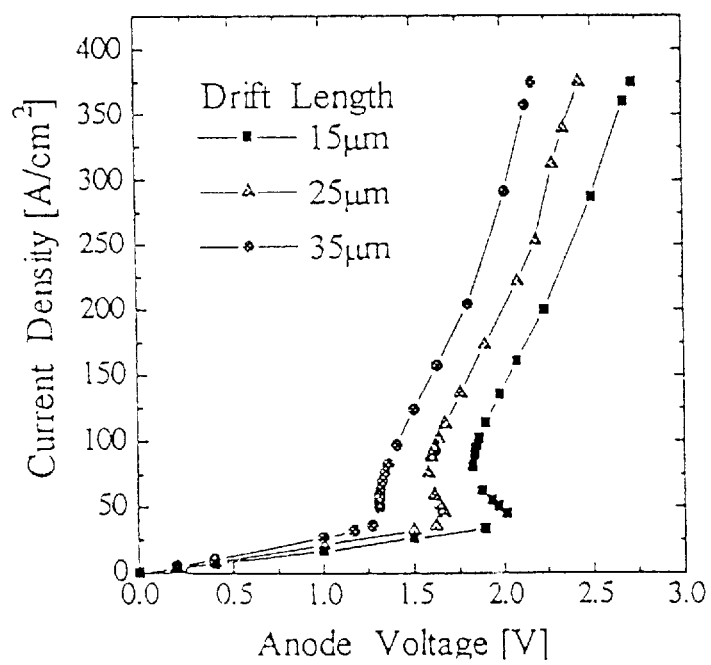
FIG. 9 is a graph showing the relation between current density and anode voltage depending on the change of the drift length of the SA-LIGBT structure of the present invention.

Also, the length of the drift plays an important role in the snap back. The reason of this is as follows. When the operation of the SA-LIGBT is converted from the LD-MOSFET mode into the IGBT mode, the drift length is concerned with only the voltage drop at the lower part of the P+ auxiliary anode region 38 among voltage drops of the entire N– epitaxial layer 14. Thus, if the drift length is increased, the voltage drop at the N– epitaxial layer 14 is also increased to drastically increase the anode voltage $V_S$. However, in the present invention, as best shown in FIG. 9, the negative resistance exhibiting region is less increased in spite of increase in the drift length, when compared to the conventional structure.

As described above, according to the present invention, by using an epitaxial layer having a resistivity larger than that of a buffer region for conversion from a MOS mode into a bipolar mode, it is possible to prevent the generation of the negative resistance region, thereby the snap back can be efficiently suppressed.

While the present invention has been described and illustrated with reference to preferred embodiments thereof, it is to be readily understood that the present invention is not limited to the embodiments, and various changes and modifications can be made therein without departing from the spirit and scope of the invention defined in the appended claims. For example, although the P+ auxiliary anode region is not formed in the aforementioned embodiments, the same or similar operational effects and results may be obtained.

What is claimed is:

1. A shorted anode lateral insulated gate bipolar transistor comprising:

a) a semiconductor layer of a first conductivity type having a surface;

b) a first current electrode formed on the surface of the semiconductor layer;

c) a second current electrode formed on the surface of the semiconductor layer and spaced apart from the first current electrode;

d) a first insulation layer formed on the surface of the semiconductor layer and disposed between the first current electrode and the second current electrode;

e) a first gate electrode formed within the first insulation layer in the vicinity of the first current electrode;

f) a second gate electrode formed within the first insulation layer in the vicinity of the second current electrode;

g) a first high concentration impurity region of a second conductivity type formed in the vicinity of the surface of the semiconductor layer below the first current electrode and extending to a first depth;

h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type and extending to a second depth which is less than the first depth;

i) a first high concentration impurity region of the first conductivity type formed in the vicinity of the surface of the semiconductor layer extending from the first gate electrode to a part of the first current electrode and extending to a third depth which is less than the second depth;

j) an intermediate concentration impurity region of the first conductivity type formed in the vicinity of the surface of the semiconductor layer disposed below the second gate electrode, below the first insulation layer between the second gate electrode and the second current electrode, and below the second current electrode and extending to a fourth depth;

k) a second high concentration impurity region of the second conductivity type formed in the vicinity of the surface of the semiconductor layer adjacent to the intermediate concentration impurity region of the first conductivity and extending to a fifth depth;

l) a third high concentration impurity region of the second conductivity type formed in the vicinity of the surface of the semiconductor layer extending from the second gate electrode to a part of the second current electrode and extending to the fifth depth; and m) a second high concentration impurity region of the first conductivity type formed to be adjacent with the third high concentration impurity region of a second conductivity type below the second current electrode and extending to the third depth.

2. A shorted anode lateral insulated gate bipolar transistor as claimed in claim 1, wherein a second insulation layer is provided between a semiconductor substrate of the second conductivity type and said semiconductor layer of the first conductivity type.

3. A shorted anode lateral insulated gate bipolar transistor as claimed in claim 1, wherein the first conductivity type is an N type, and the second conductivity type is a P type.

4. A shorted anode lateral insulated gate bipolar transistor comprising:

a) a semiconductor layer of a first conductivity type having a surface;

b) a first current electrode formed on the surface of the semiconductor layer;

c) a second current electrode formed in a trench formed in the semiconductor layer and spaced apart from the first current electrode;

d) a first insulation layer formed on the surface of the semiconductor layer and disposed between the first current electrode and the second current electrode;

e) a first gate electrode formed within the first insulation layer in the vicinity of the first current electrode;

f) a second gate electrode formed within the first insulation layer in the vicinity of the second current electrode;

g) a first high concentration impurity region of a second conductivity type formed in the vicinity of the surface of the semiconductor layer below the first current electrode and extending to a first depth;

h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type and extending to a second depth which is less than the first depth;

i) a first high concentration impurity region of the first conductivity type formed in the vicinity of the surface of the semiconductor layer extending from the first gate electrode to a part of the first current electrode and extending to a third depth which is less than the second depth;

j) an intermediate concentration impurity region of the first conductivity type formed in the vicinity of the surface of the semiconductor layer disposed below the second gate electrode, below the first insulation layer between the second gate electrode and the second current electrode, and below the second current electrode and extending to a fourth depth;

k) a second high concentration impurity region of the second conductivity type formed in the vicinity of the surface of the semiconductor layer adjacent to the intermediate concentration impurity region of the first conductivity and extending to a fifth depth; and l) a third high concentration impurity region of the second conductivity type formed in the vicinity of the surface of the semiconductor layer below the second gate electrode and below the first insulation layer between the second gate electrode and second current electrode and extending to the fifth depth, and one side of which is adjacent the second current electrode.

5. A shorted anode lateral insulated gate bipolar transistor as claimed in claim 4, wherein a second insulation layer is provided between a semiconductor substrate of the second conductivity type and said semiconductor layer of the first conductivity type.

6. A shorted anode lateral insulated gate bipolar transistor as claimed in claim 4, wherein the first conductivity type is an N type, and the second conductivity type is a P type.

7. A shorted anode lateral insulated gate bipolar transistor comprising:

a) a semiconductor layer of a first conductivity type having a surface;

b) a first current electrode formed on the surface of the semiconductor layer;

c) a second current electrode formed on the surface of the semiconductor layer and spaced apart from the first current electrode;

d) a first insulation layer formed on the surface of the semiconductor layer and disposed between the first current electrode and the second current electrode;

e) a first gate electrode formed within the first insulation layer in the vicinity of the first current electrode;

f) a second gate electrode formed within the first insulation layer in the vicinity of the second current electrode;

g) a first high concentration impurity region of a second conductivity type formed in the vicinity of the surface of the semiconductor layer below the first current electrode and extending to a first depth;

h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type and extending to a second depth which is less than the first depth;

i) a first high concentration impurity region of the first conductivity type formed in the vicinity of the surface of the semiconductor layer extending from the first gate electrode to a part of the first current electrode and extending to a third depth which is less than the second depth;

j) an intermediate concentration impurity region of the first conductivity type formed in the vicinity of the surface of the semiconductor layer disposed below the second gate electrode, below the first insulation layer between the second gate electrode and the second current electrode, and below the second current electrode and extending to a fourth depth;

k) a third high concentration impurity region of the second conductivity type formed in the vicinity of the surface of the semiconductor layer extending from the second gate electrode to a part of the second current electrode and extending to a fifth depth; and l) a second high concentration impurity region of the first conductivity type formed to be adjacent the third high concentration impurity region of a second conductivity type below the second current electrode and extending to the third depth.

8. A shorted anode lateral insulated gate bipolar transistor comprising:

a) a semiconductor layer of a first conductivity type having a surface;

b) a first current electrode formed on the surface of the semiconductor layer;

c) a second current electrode formed in a trench formed in the semiconductor layer and spaced apart from the first current electrode;

d) a first insulation layer formed on the surface of the semiconductor layer and disposed between the first current electrode and the second current electrode;

e) a first gate electrode formed within the first insulation layer in the vicinity of the first current electrode;

f) a second gate electrode formed within the first insulation layer in the vicinity of the second current electrode;

g) a first high concentration impurity region of a second conductivity type formed in the vicinity of the surface of the semiconductor layer below the first current electrode and extending to a first depth;

h) a low concentration impurity region of the second conductivity type formed in the vicinity of the surface of the semiconductor layer below the first insulation layer between the first gate electrode and the first current electrode and below the first gate electrode to be adjacent the first high concentration impurity region of the second conductivity type and extending to a second depth which is less than the first depth;

i) a first high concentration impurity region of the first conductivity type formed in the vicinity of the surface of the semiconductor layer extending from the first gate electrode to a part of the first current electrode and extending to a third depth which is less than the second depth;

j) an intermediate concentration impurity region of the first conductivity type formed in the vicinity of the surface of the semiconductor layer disposed below the second gate electrode, below the first insulation layer between the second gate electrode and the second current electrode, and below the second current electrode and extending to a fourth depth; and k) a third high concentration impurity region of the second conductivity type formed in the vicinity of the surface of the semiconductor layer below the second gate electrode and below the first insulation layer between the second gate electrode and second current electrode and extending to the fifth depth, and one side of which is adjacent the second current electrode.

* * * * *